United States Patent [19]
Schneider et al.

[11] Patent Number: 5,932,966
[45] Date of Patent: Aug. 3, 1999

[54] ELECTRON SOURCES UTILIZING PATTERNED NEGATIVE ELECTRON AFFINITY PHOTOCATHODES

[75] Inventors: James E. Schneider, Fairfield, Ohio; Kenneth A. Costello, Union City, Calif.; Mark A. McCord, Mountain View, Calif.; R. Fabian Pease, Menlo Park, Calif.; Aaron W. Baum, San Francisco, Calif.

[73] Assignees: Intevac, Inc., Santa Clara; Board of Trustees of the Leland Stanford Jr. University, Stanford, Calif.

[21] Appl. No.: 08/987,397

[22] Filed: Dec. 9, 1997

Related U.S. Application Data

[63] Continuation-in-part of application No. 08/863,493, May 27, 1997, which is a continuation-in-part of application No. 08/499,945, Jul. 10, 1995, Pat. No. 5,684,360.

[51] Int. Cl.$^6$ ...................................................... H01J 40/06
[52] U.S. Cl. ......................... 313/542; 313/530; 313/541; 313/539; 313/544
[58] Field of Search ..................................... 313/524, 530, 313/541, 544, 539, 523; 250/214 VT, 423 P, 492.2, 492.24, 211 R

[56] References Cited

U.S. PATENT DOCUMENTS

| | | | |
|---|---|---|---|
| 4,460,831 | 7/1984 | Oettinger et al. | 250/492.2 |
| 4,820,927 | 4/1989 | Langner et al. | 250/492.2 |
| 4,868,380 | 9/1989 | Booman et al. | 250/211 R |
| 4,906,894 | 3/1990 | Miyawaki et al. | 313/542 |
| 4,970,392 | 11/1990 | Oettinger et al. | 250/423 P |
| 5,039,862 | 8/1991 | Smith et al. | 250/432 P |
| 5,684,360 | 11/1997 | Baum et al. | 313/542 |

OTHER PUBLICATIONS

A. Herrera–Gomez et al. SPIE vol. 2022. Photodetectors and Power Meters. Jul. 1993. p. 51.

C. Sanford, Doctoral Thesis, Cornell Univ. Dept. of Electrical Engineering. 1990.

J. Schneider et al. "Semiconductor on Glass Photocathodes as High Performance Sources for Parallel Electron Beam Lithography", J. Vac.Sci.Technol., Part B, vol. 14, No.6, Nov.–Dec. 1996 pp. 3782–3786.

E. Santos et al, "Selective Emission of Electrons from Patterned Negative Electron Affinity Cathodes", IEEE Trans. on Electron Devices. vol. 41, No. 3, Mar. 1994, pp. 607–611.

A. Baum et al. "Semiconductor on Glass Photocathodes for High Throughput Maskless Electron Beam Lithography", 41st Electron Ion & Photon Beam & Nanolithography Conference, 1997.

*Primary Examiner*—Sandra O'Shea
*Assistant Examiner*—Joseph Williams
*Attorney, Agent, or Firm*—Stanley Z. Cole; William McClellan

[57] ABSTRACT

An electron source includes a negative electron affinity photocathode on a light-transmissive substrate and a light beam generator for directing a light beam through the substrate at the photocathode for exciting electrons into the conduction band. The photocathode has at least one active area for emission of electrons with dimensions of less than about two micrometers. The electron source further includes electron optics for forming the electrons into an electron beam and a vacuum enclosure for maintaining the photocathode at high vacuum. The photocathode is patterned to define emission areas. A patterned mask may be located on the emission surface of the active layer, may be buried within the active layer or may be located between the active layer and the substrate.

26 Claims, 9 Drawing Sheets

ELECTRON SOURCES UTILIZING PATTERNED NEGATIVE ELECTRON AFFINITY PHOTOCATHODES

CROSS REFERENCE TO RELATED APPLICATIONS

This application is a continuation-in-part of pending application Ser. No. 08/863,493 filed May 27, 1997, which in turn is a continuation-in-part of application Ser. No. 08/499,945 filed Jul. 10, 1995, now U.S. Pat. No. 5,684,360.

This invention was made with Government support under DARPA N00014-92-J-1996. The Government has certain rights in the invention.

FIELD OF THE INVENTION

This invention relates to electron beam sources and, more particularly, to electron sources which utilize negative electron affinity photocathodes with one or more ultra-small active emission areas to produce high brightness, small diameter electron beams.

BACKGROUND OF THE INVENTION

High resolution electron beam systems include scanning electron microscopes, defect detection tools, VLSI testing tools and mask making and wafer exposure tools. In general, these systems include an electron source and electron optics for accelerating the electrons into an electron beam and focusing the electrons onto a target. These systems require an electron source with a high brightness and a small source size. Field emission electron sources have frequently been used in high resolution electron beam systems.

Negative electron affinity (NEA) photocathode electron sources have been proposed in the prior art. A negative electron affinity photocathode includes a semiconductor, usually a III-V compound such as gallium arsenide, heavily p-doped so as to raise the conduction band relative to the Fermi level. The semiconductor surface is coated with an activation layer, a few monolayers thick which lowers the work function so that the conduction band in the bulk is above the vacuum level, a condition of negative electron affinity. When electrons are excited by light energy into the conduction band within a diffusion length (typically a few micrometers) of the surface, many of them will diffuse to the surface where they will have a high probability of escaping into the vacuum, as described by A. Herrera-Gomez and W. E. Spicer in SPIE Vol. 2022, Photodetectors and Power Meters (1993), p. 51.

Most previous work on NEA photocathode electron sources has been performed on reflection mode photocathodes. In this mode, a light beam is incident on the emitting surface of the cathode, and, due to the need for electron optics above the cathode surface for accelerating and focusing the emitted electrons, the final lens used to focus the light cannot be positioned close to the photocathode. This necessitates low numerical aperture imaging, which results in large spot sizes and emission areas, typically at least a few tens of micrometers.

C. Sanford, as described in Doctoral Thesis, Cornell University Dept. of Electrical Engineering (1990), constructed free-standing membrane transmission mode photocathodes, as well as NEA photocathodes with integrated gate electrodes. In the former case, the final lens of the light optics was over 10 centimeters from the cathode. The emission area was estimated to be approximately 15 micrometers in diameter. In the second case, a flood illumination was used, and the emitting areas were greater than 100 micrometers in diameter.

A scanned electron beam system, including an electron beam source using an NEA activated photoemitter as the cathode, is disclosed in U.S. Pat. No. 4,820,927 issued Apr. 11, 1989 to Langner et al. The disclosed electron source is operated in the transmission mode and is stated to have a typical cathode emitting diameter of 18.75 micrometers. U.S. Pat. No. 4,970,392 issued Nov. 13, 1990 emphasizes the need for high brightness electron sources, but contains no discussion of the importance of emission area. Electron beam sources utilizing photocathodes are also disclosed in U.S. Pat. No. 4,460,831 issued Jul. 17, 1984 to Oettinger et al; U.S. Pat. No. 5,039,862 issued Aug. 13, 1991 to Smith et al; and U.S. Pat. No. 4,906,894 issued Mar. 6, 1990 to Miyawaki et al. The disclosed electron sources and systems do not provide for the achievement of the small spot sizes achievable by the present invention, and thus, for reasons explained below, cannot provide the high brightness necessary for high-performance electron beam instrumentation.

Achieving a small spot size at the emission surface of an NEA photocathode is crucial for several reasons. First, a small spot size may be used to maximize quantum efficiency and source brightness by minimizing the number of electrons trapped in surface states. Second, and most relevant for electron beam lithography, a reduction of the emission spot size allows for a reduction in the system demagnification necessary to achieve 0.1 micrometer feature sizes. Less demagnification allows nearly 100% of the current generated by the source to reach the wafer when 0.1 micrometer diameter emission areas are used, in sharp contrast to current electron beam instrumentation, which typically uses less than 1% of the emitted current. Since all current generated by the source contributes to space charge blurring of the beam, it is important to maximize the fraction of the current delivered to the wafer by restricting the emission area. See, for example, Schneider et al., "Semiconductor on Glass Photocathodes as High Performance Sources for Parallel Electron Beam Lithography", *J. Vac. Sci. Technol., Part B*, Vol. 14, No. 6, pages 3782–3786, November–December 1996.

A technique for achieving NEA activation on patterned gallium arsenide surfaces is disclosed by E. Santos et al in "Selective Emission of Electrons from Patterned Negative Electron Affinity Cathodes", *IEEE Trans. on Electron Devices*. Vol. 41, No. 3, March 1994, pages 607–611. The authors describe photocathodes onto which large scale electrode structures were fabricated.

SUMMARY OF THE INVENTION

According to a first aspect of the invention, a negative electron affinity photocathode comprises a light-transmissive substrate, a negative electron affinity active layer disposed on the substrate and a patterned mask associated with the active layer. The mask has one or more openings that define areas of the active layer for emission of electrons by negative electron affinity when the active layer is stimulated by a light beam directed through the substrate.

In a first embodiment, the mask comprises a blocking layer disposed on an emission surface of the active layer. In a second embodiment, the mask comprises a buried blocking layer disposed within the active layer. In a third embodiment, the mask comprises a blocking layer disposed between the active layer and the substrate. The mask may comprise an electron blocking layer for blocking electrons emitted by the active layer or a light blocking layer for blocking the light beam directed through the substrate at the active layer. The mask may comprise a metal layer, a semiconductor layer, a dielectric layer or an electrically inactive region of the active layer.

Where the patterned mask is a light blocking layer, the photocathode may further comprise a material having a high index of refraction located in the openings in the patterned mask. The high index material may be shaped as a lens adjacent to the openings to increase the light that passes through the openings.

According to another aspect of the invention, an electron source is provided. The electron source comprises a light-transmissive substrate, a negative electron affinity active layer disposed on the substrate, and a mask associated with the active layer. The mask has one or more openings that define areas of the active layer for emission of electrons. The electron source further comprises a light beam generator for directing a light beam through the light-transmissive substrate at the active layer for exciting electrons into the conduction band of the active layer, electron optics for forming the electrons emitted from the emission areas of the active layer into an electron beam, and a vacuum enclosure for maintaining the active layer at high vacuum such that electrons in the conduction band of the active layer have higher energies than electrons in the vacuum enclosure adjacent to the active layer and have a high probability of emission into the vacuum enclosure from the emission areas of the active layer.

According to a further aspect of the invention, a negative electron affinity photocathode comprises a light-transmissive substrate and a negative electron affinity active layer disposed on the substrate. The active layer has an emission surface and is laterally graded with respect to bandgap in a direction parallel to the emission surface. The laterally graded active layer defines low bandgap regions for emission of electrons by negative electron affinity when the active layer is stimulated by a light beam directed through the substrate. The laterally graded active layer further defines high bandgap regions surrounding the low bandgap regions.

According to another aspect of the invention, a negative electron affinity photocathode comprises a light-transmissive substrate, an inactive layer disposed on the substrate and one or more pillars of negative electron affinity active material extending through the inactive layer from the substrate to a surface of the inactive layer. The pillars define areas for emission of electrons by negative electron affinity when the pillars are stimulated by a light beam directed through the substrate.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
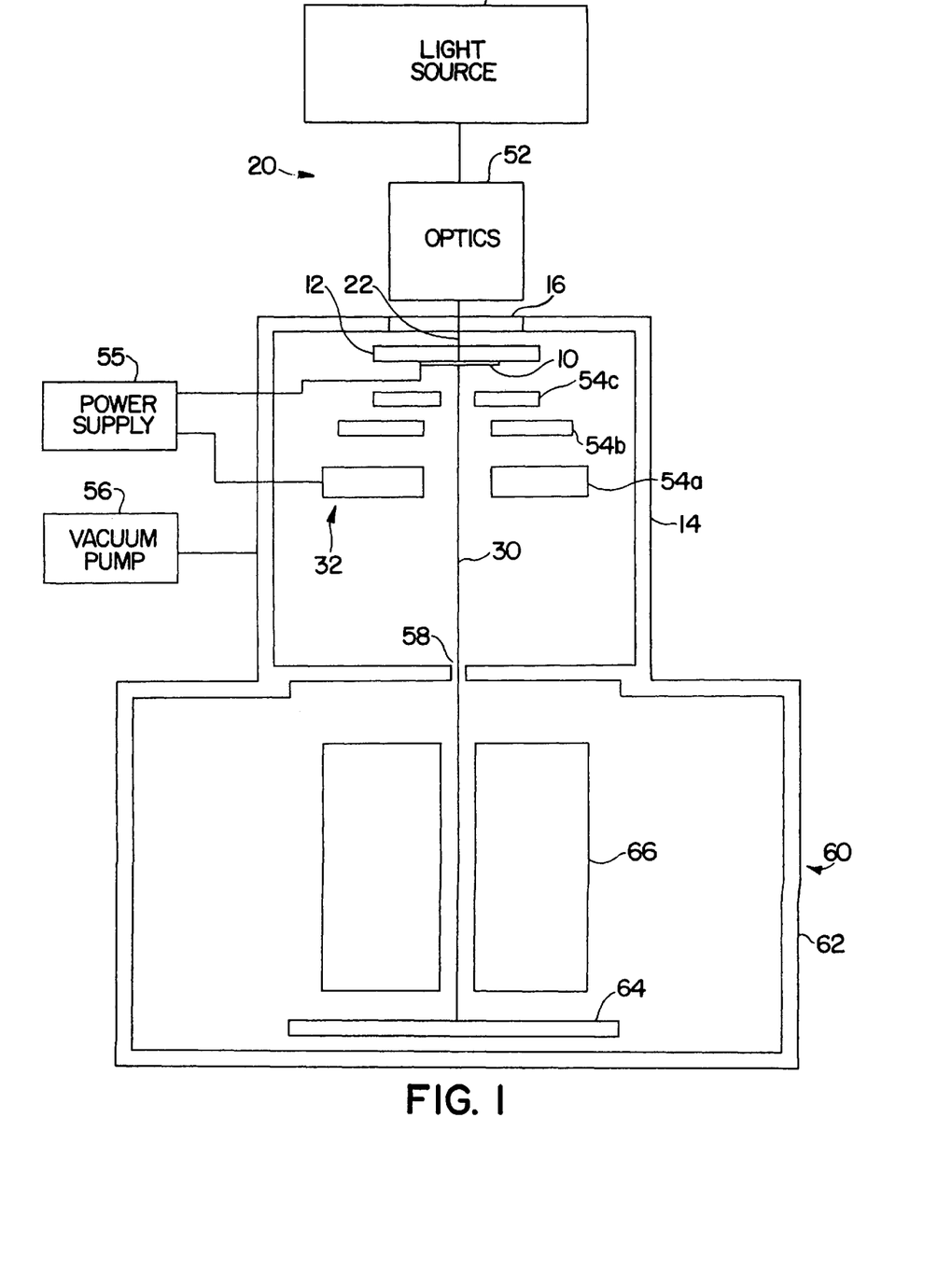
FIG. 1 is a block diagram of an example of an electron beam system utilizing an electron source in accordance with the present invention.
Figure 2:
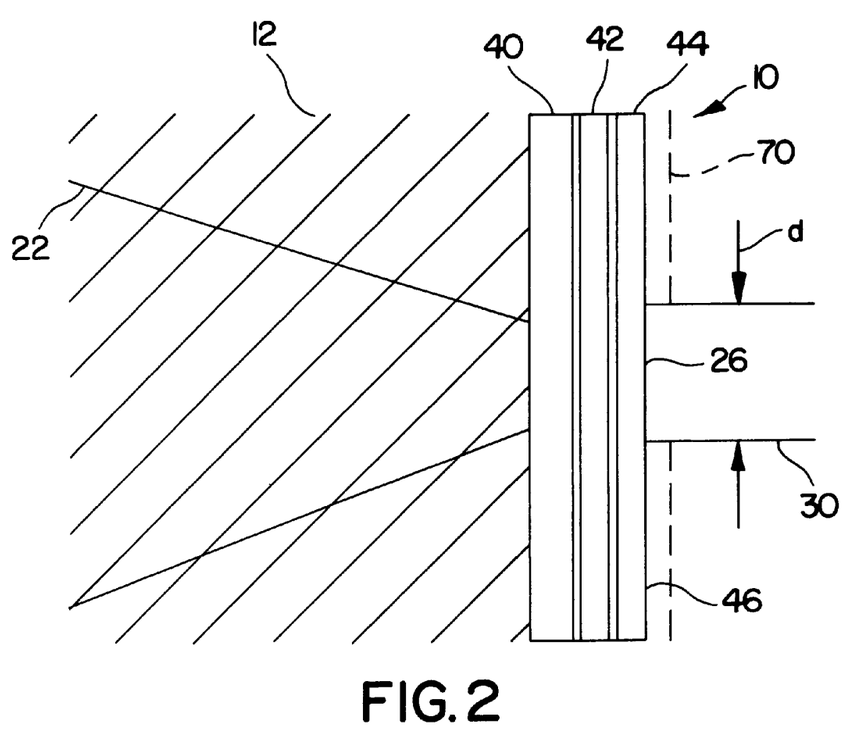
FIG. 2 is a partial cross-sectional view of the photocathode in the electron source of FIG. 1.

A block diagram of an example of an electron beam system utilizing an electron source in accordance with the present invention is shown in FIG. 1. A photocathode 10 is located on a surface of a light-transmissive substrate 12. An enlarged partial cross-sectional view of substrate 12 and photocathode 10 is shown in FIG. 2. The photocathode 10 is located within a vacuum enclosure 14 that maintains an ultra-high vacuum environment during operation. The vacuum enclosure 14 includes a vacuum window 16 for transmission of a light beam as described below. In an alternative configuration, the light-transmissive substrate 12 may form part of the vacuum enclosure wall. A light beam generator 20 directs a light beam 22 through vacuum window 16 and substrate 12 to an active area 26 (see FIG. 2) of photocathode 10. The light beam 22 causes the active area of 26 of photocathode 10 to emit electrons into the vacuum region defined by vacuum enclosure 14. The electrons are formed into an electron beam 30 by electron optics 32.

In accordance with an important aspect of the invention, the active emission area 26 of photocathode 10 has a dimension d parallel to the surface of photocathode 10 that is preferably about two micrometers or less and is most preferably about one micrometer or less. The active area 26 is typically more or less circular in shape, but is not limited to a circular shape. For example, the active area 26 may be in the form of a line, where the linewidth has a dimension d as described above. Additionally, the active area may comprise a predetermined pattern on photocathode 10. The advantages of using a very small active area 26 (dimension d less than about two micrometers) are discussed below. The photocathode 10 may have one active emission area 26 as shown in FIG. 2 and described above. Alternatively, the photocathode 10 may have two or more active emission areas 26.

The active emission area 26 of photocathode 10 may be defined in two ways. In a first approach, the active emission area is defined by and is a direct result of light beam 22. Typically, the dimension d of the active area 26 is approximately equal to the cross sectional diameter of the light beam 22. The active area 26 of electron emission may be somewhat larger than light beam 22 due to lateral spreading of electrons within photocathode 10. In this approach, movement of the light beam 22 causes the active area 26 to move relative to photocathode 10.

In a second approach, the active emission area 26 is predefined by surface modification of photocathode 10. For example, the photocathode 10 may be coated with a thin blocking layer, such as aluminum, having at least one opening that defines active area 26. In an alternative approach, photocathode 10 may be subjected to ion implantation over its surface area except in active area 26. The ion implantation produces defects in the photocathode material, which reduce its effectiveness as an electron emitter. When the active area 26 is defined by surface modification of the photocathode, electron emission is caused by light beam 22. However, the active area 26 is fixed in position with respect to photocathode 10. In addition, since the dimension of the active area 26 is defined by surface modification, the light beam 22 is not required to be as small as the active area 26.

Figure 3:
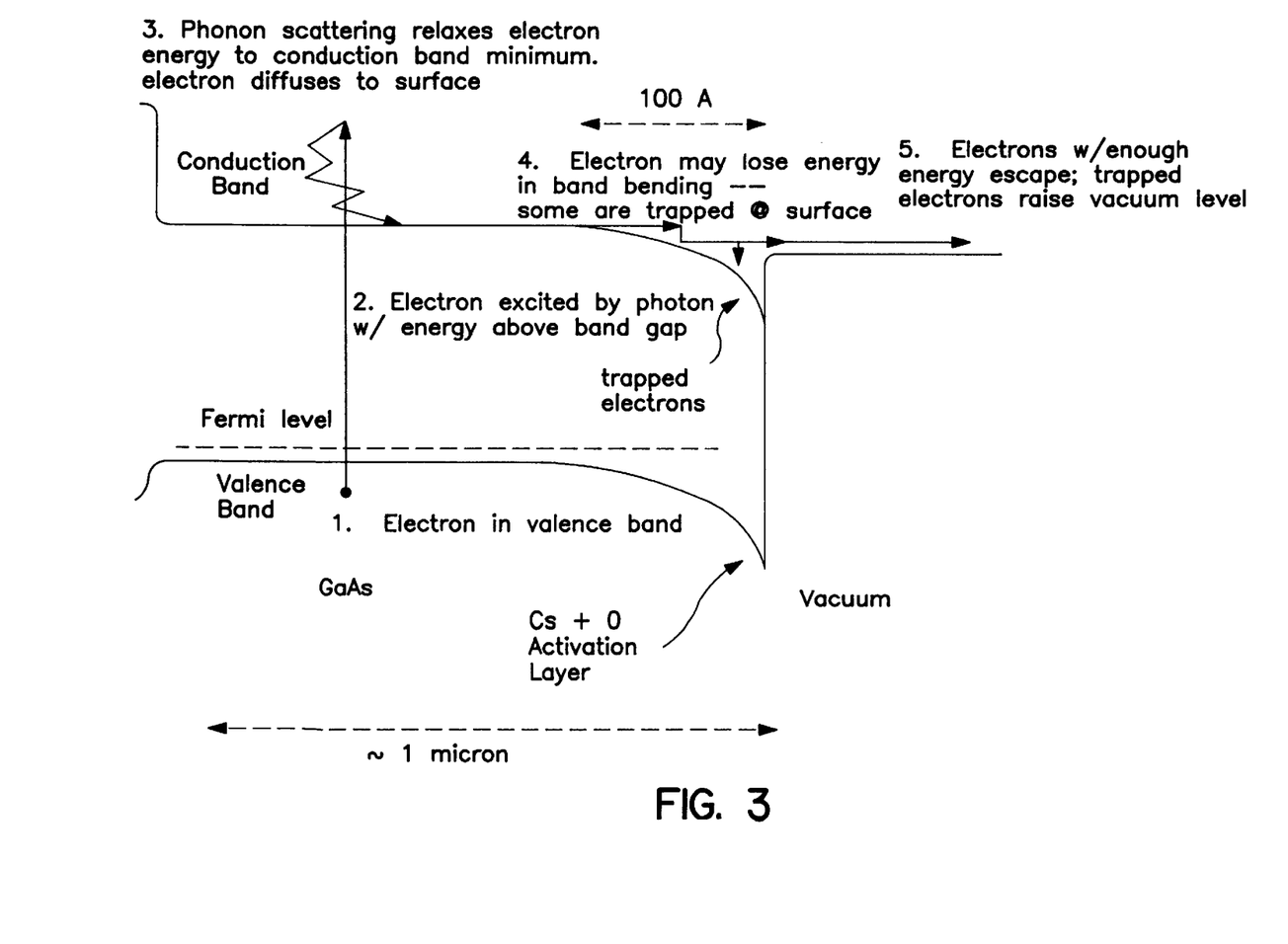
FIG. 3 is an energy level diagram that illustrates negative electron affinity photoemission.

The photocathode 10 is a negative electron affinity photocathode. The basic principle of negative electron affinity electron emission is illustrated in FIG. 3. The photocathode comprises a semiconductor, usually a Column III-V compound such as gallium arsenide, heavily p-doped ($1-5 \times 10^{19}$) with a material such as zinc, magnesium, or carbon, so as to raise the conduction band relative to the Fermi level. The cleaned semiconductor surface is exposed to cesium and oxygen to form an activating layer a few monolayers thick. The activation layer lowers the work function so that the conduction band in the bulk is above the vacuum level, the condition of negative electron affinity. When electrons are excited from the valence band into the conduction band within a diffusion length (typically a few micrometers) of the surface, many of the electrons diffuse to the surface, where they have a high probability of escaping the surface into the vacuum.

In general, the photocathode may be any material that meets the negative electron affinity condition specified above. The photocathode is typically a semiconductor material. Compounds of Column III materials such as gallium, aluminum and indium and Column V materials such as phosphorous, arsenic and nitrogen are typically used. Other suitable NEA materials include diamond, silicon carbide, aluminum nitride and gallium nitride. Some NEA materials may not require an activation layer. The activation layer may alternately be formed by exposure to cesium only or cesium and nitrogen trifluoride; other potentially low work function materials may also be used. The photocathode 10 is preferably very thin to limit lateral spreading of electrons within the photocathode, which would increase the dimension of the active area 26. Preferred thicknesses of cathode 10 are about one micrometer or less.

The photocathode 10 may optionally include a bandgap ramp which produces an electric field through the thickness of the photocathode. Bandgap ramps are described generally in U.S. Pat. No. 3,631,303 issued Dec. 28, 1971 to Antypas et al. The bandgap ramp may be produced by a density gradient in a constituent of the photocathode material. For example, an aluminum gallium arsenide photocathode may have a variable density of aluminum through its thickness. The purpose of the electric field within the photocathode material is to direct electrons toward the photocathode surface into the vacuum and to limit lateral movement of electrons within the photocathode material. As indicated, lateral movement of electrons tends to increase the lateral dimension of the active emission area of photocathode 10.

An example of a suitable photocathode 10 is described with reference to FIG. 2. An anti-reflection coating 40 is affixed to the surface of light-transmissive substrate 12. The substrate 12 should be substantially transparent to the wavelength or wavelengths of the light beam 22. A preferred substrate is glass or sapphire. The anti-reflection coating is made of one or more layers of material with thicknesses and refractive indices chosen to minimize reflection of the illuminating light at the interface between the substrate glass and the cathode structure. Suitable anti-reflection coatings include silicon nitride and silicon oxynitride having a thickness of one quarter of the excitation wavelength. The photocathode 10 includes a diffusion blocking layer 42 on anti-reflection coating 40, followed by an active layer 44 having a surface activation layer 46. In a preferred embodiment, the diffusion blocking layer 42 comprises an AlGaAs or AlGaAsP layer having a thickness, typically from approximately 400 angstroms to a few micrometers, that minimizes absorption at the illuminating wavelength while forming an energy barrier to the diffusion of electrons in the conduction band of the active layer without promoting their recombination. The active layer comprises GaAs, GaAsP,AlGaAs or InGaAsP having a thickness of about one micrometer or less, and the activation layer 46 comprises $Cs_xO_y$ that is a few atoms thick.

The photocathode is maintained at ultra high vacuum so that the activating layer is not contaminated and maintains its integrity for a reasonable period of time. Contamination of the activating layer can reduce its effectiveness at lowering the work function of the cathode, possibly reducing or eliminating the condition of negative electron affinity. The vacuum level discussed in connection with negative electron affinity photocathodes is the minimum energy of an electron just above the surface of the cathode; an electron inside the photocathode with an energy less than this value cannot escape and will be trapped at the surface, where it will contribute to the surface trapped electron density.

The light beam generator 20 includes a light source 50 for generating light of a desired wavelength and intensity, and optics 52 for focusing the light into a small diameter beam at the surface of photocathode 10. The light source 50 may comprise a laser or a broadband light source. The broadband light source may include a suitable optical filter to produce light of a desired wavelength or wavelength range. For photocathodes fabricated of Column III-V materials, the wavelength is typically in the range of 300–800 nanometers. The selected wavelength depends on the absorption band of the photocathode material to excite electrons to the conduction band and on the thickness of the photocathode. The power level of the light source 50 is relatively low. Typically, power levels less than 10 milliwatts per emission area are required for excitation of photocathode 10. The optics 52 converts the light generated by source 50 into light beam 22 having a desired very small cross-sectional dimension at photocathode 10. As indicated above, the cross-sectional dimension of light beam 22 is preferably less than about two micrometers. This dimension may be achieved using a system of two or more lenses for focusing the image of an aperture on the photocathode, using a high numerical aperture, for minimum diffraction-limited spot size on the active region 26 of photocathode 10. The optics 52 may incorporate correction for spherical aberration of the vacuum window 16 and the substrate 12. The nominal diffraction-limited spot size for an optical system that is fully corrected for spherical and other aberrations is: diameter= wavelength/(2×NA), where NA is the numerical aperture, which is defined as the sine of the semi-angle of convergence of the beam times the refractive index of the medium in which the focusing is taking place. The preferred numerical aperture is at least 0.5.

The transmission configuration illustrated in FIG. 1 wherein the light beam 22 is transmitted through substrate 12 to one side of photocathode 10 and the electron beam 30 is emitted from the other side of photocathode 10, is advantageous in achieving a very small active area 26. In particular, the transmission configuration permits the final lens of the optics to be positioned close to the photocathode 10 and to have a large numerical aperture, thus permitting light beam 22 to have a very small diameter.

The vacuum enclosure 14 is connected through a suitable conduit to a vacuum pump 56 or a combination of vacuum pumps for maintaining the interior of enclosure 14 at ultra high vacuum, typically less than $10^{-9}$ torr. Typically, the required vacuum level may be in a range of $10^{-10}$ to $10^{-11}$ torr. The vacuum window 16 through which light beam 22 passes preferably has very low optical aberrations. The vacuum window 16 may be flat or may be in the form of a lens for further focusing of the light beam 22 from optics 52. The vacuum window 16 should be substantially transparent to the wavelength or wavelengths of light beam 22. The vacuum enclosure 14 includes a diffusion-limiting aperture 58 for limiting the rate of movement of contaminants from the main electron beam column into the electron source region. The electron optics 32 may include one or more electrodes, such as electrodes 54a, 54b, 54c, connected to a power supply 55 which suitably biases the electrodes for forming electron beam 30. The electron beam 30 passes through aperture 58 into main electron beam column 60. The electron beam column includes a vacuum enclosure 62, a workpiece 64, such as a semiconductor wafer, and electron optics 66. The electron beam column in general incorporates all equipment necessary to create a vacuum for the application, to form the electron beam into a probe appropriate for the application, to scan the beam across the workpiece 64, to collect electrons or other particles scattered from the workpiece, to translate the workpiece and any other functions that may be required for the application. Techniques for the design and fabrication of electron beam columns are generally known to those skilled in the art. The electron source comprises the photocathode 10 on substrate 12, light beam generator 20, vacuum enclosure 14 and electron optics 32. The electron source may include additional features such as a load lock (not shown) for replacement of photocathodes and an activation region (not shown) for heat cleaning and activation of the photocathode.

As indicated previously, the active area 26 of photocathode 10 for electron emission can be established by the light beam 22 itself or by modification of the surface of the photocathode 10 to establish one or more predefined active areas. The basic idea of using surface modification to limit the active electron emission area is to alter the surface or near surface structure of the photocathode so that electrons are emitted only from a predefined area. By using high resolution lithographic techniques, the active areas may have much finer structure than is possible by defining the active areas with the light beam. For example, active areas for emission of electrons smaller than 0.1 micrometer may be fabricated. In addition, it is advantageous if the material on the non-emitting surface is efficient at collecting and eliminating the surface-trapped charge, thereby reducing the possibility of cutoff due to the surface-trapped electrons.

One approach is to use a metal layer 70, shown in phantom FIG. 2, deposited on the surface of photocathode 10 or grown into the structure close to the surface or on the surface. The metal layer 70, which may be platinum or aluminum, is provided with an opening of dimension that corresponds to the desired dimension d of active emission area 26. The metal layer blocks emission from the covered areas and conducts away the trapped charge more efficiently than bare semiconductor material. Other materials, such as other semiconductors or semimetals, may be deposited on the surface or grown into the structure to block emission of electrons except from a limited active area. Ohmic contacts may be used to define the active emission area.

The area of photocathode 10 which is not to emit electrons may be treated in other ways, such as ion implantation, to alter material properties to thereby prevent electrons from being emitted from these areas. The ion implantation may produce a high density of defects in the non-emitting regions, which prevents electron emission and speeds recombination of surface trapped electrons which entered into the treated region.

The use of NEA photocathodes with extremely small active emission areas less than about two micrometers provides a number of advantages which, taken together, create the possibility of using this configuration in high performance, high resolution electron beam systems, including those that currently use field emission electron sources. An important advantage is the higher brightness obtainable from smaller emission areas, as the surface-trapped electrons which limit current density move out of the active emission area at a high rate. When a semiconductor is in the condition of negative electron affinity, the energy of an electron in the conduction band is greater than that of an electron immediately outside the solid, as illustrated in FIG. 3. This is typically achieved through heavy p-doping and the application of an activation layer that lowers the work function until the NEA condition is achieved. Electrons excited into the conduction band thermalize and diffuse to the surface, where they may be emitted or trapped in the surface region. The trapped electrons form a dipole that tends to cancel out the field of the depletion region at the surface, raising the vacuum energy level relative to the bulk conduction band minimum until emission is blocked. Previous workers have found strong evidence of this effect on large area emission from NEA photocathodes and have found that the trapped electrons are eliminated by holes tunneling or thermionically emitting over the depletion region, as described by A. Herrera-Gomez and W. E. Spicer in SPIE Vol. 2022, Photodetectors and Power Meters (1993), p. 51. The rate of arrival of these holes limited the current density emitted from the cathodes, as increasing the amount of light stimulating the cathode did not increase the emission beyond a certain level.

Figure 4A:
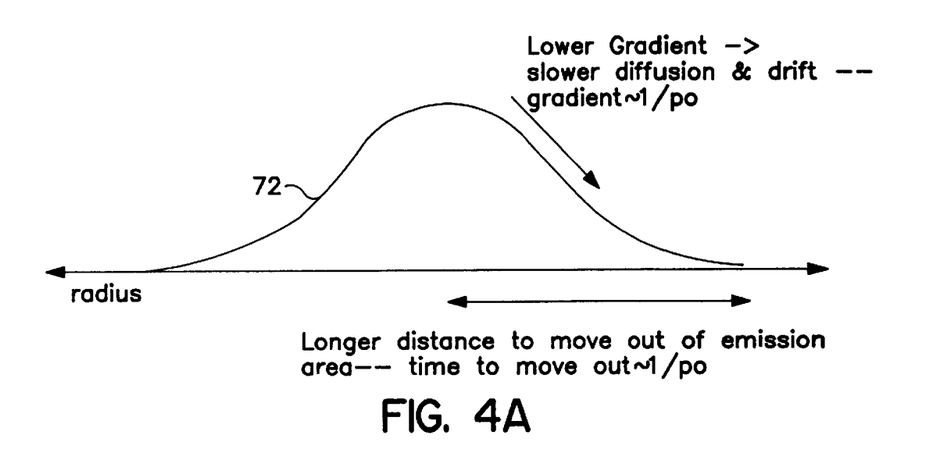
FIGS. 4A and 4B are graphs of trapped electron density as a function of radius for relatively large and relatively small emission areas, respectively.
Figure 4B:
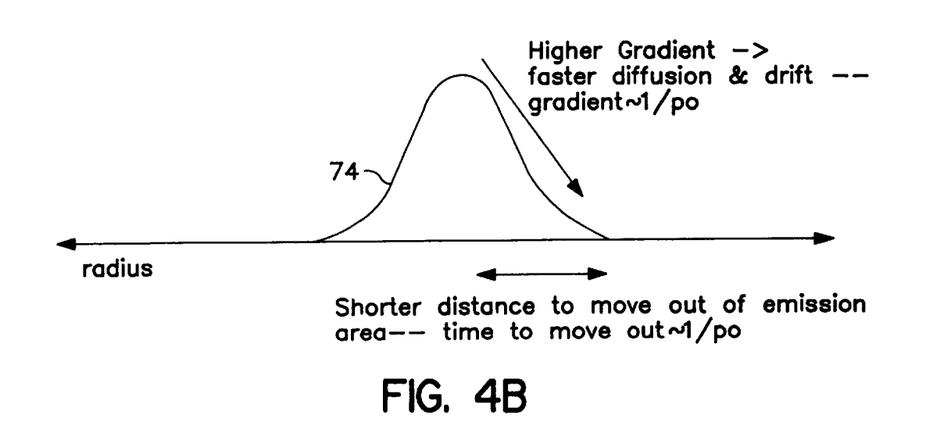

For a very small active emission area, the trapped electrons have an alternate path. Due to the higher lateral gradients of trapped electron density and surface voltage, the trapped electrons are highly likely to diffuse and drift laterally out of the emission area, reducing the dipole. This effect is enhanced for small diameter active emission areas, as illustrated in FIGS. 4A and 4B. Curve 72 in FIG. 4A illustrates the trapped electron density gradient for a relatively large active emission area, and curve 74 in FIG. 4B illustrates the higher trapped electron density gradient that occurs in a very small diameter active emission area. The higher gradient produces faster diffusion and drift of trapped electrons from the active area.

Experiments using a 1.74 micrometer diameter emission area have demonstrated DC current densities over 100 times higher than have previously been reported from an NEA cathode. Since the photocathode active region was approximately 1.5 micrometers thick, the light beam diameter was probably much smaller. A thinner cathode, with a bandgap ramp to push electrons out with minimum lateral diffusion, could achieve a much smaller active emission area, limited ultimately by the diffraction-limited spot size, or by the size of an emission controlling aperture on the surface. The rate of lateral diffusion and drift of the trapped electrons is roughly proportional to $1/d^2$, where d is the active emission area diameter. Thus, going from a 5 micrometer active area to a 0.5 micrometer active area provides 100 times more movement of the trapped electrons, which translates roughly to 100 times greater emitted current density. Thus, the smallest possible active emission area is clearly of great importance to brightness.

A second advantage of a small active emission area is the reduced demagnification necessary in high resolution electron beam systems. Since the amount demagnification in practical electron lenses is limited (typically 25× or less), the use of a smaller active emission area is key to the construction of an electron beam system of convenient size and complexity. Since most such systems currently employ field emission sources which have effective source sizes of amount 10 nanometers or less, it is likely that an NEA source would employ additional demagnification to achieve the same probe size. If this demagnification is to be achieved with one lens, the source size should be significantly smaller than one micrometer, and if possible 0.25 micrometer or maller.

Lower demagnification has a number of advantages in addition to simplifying column design. If multiple beams or patterns are projected from the cathode surface to the workpiece, a larger area of the workpiece can be exposed. This is important because emission from only a limited area of the cathode can be focused onto the workpiece with low aberrations. Thus, a higher throughput can be realized as a greater number of emission points can be used, or a larger area on a target wafer can be written at one time. As described below, the active emission area can be scanned across the cathode surface using light optics, thereby eliminating the need for electron optic scanning. In this case, lower demagnification means a larger scan field.

Finally, using a very small active emission area reduces the total amount of current emitted (although, because of the lower demagnification, the amount used stays the same). In multiple beam and cathode projection systems, beam-beam interaction, a major problem in such systems, is reduced. It is known that for a fixed current density, a smaller emission area gives a lower space-charge induced energy spread. Since lower energy spread is an attractive feature of the NEA cathodes, this is an important consideration. A smaller amount of current emitted increases cathode lifetime, as electron-stimulated desorption of poisoning gases and ionization of residual gases, which can greatly shorten cathode lifetime, are reduced proportionately.

Different embodiments of the light beam generator 20 are shown in FIGS. 5–8. As indicated above, two or more electron beams may be emitted from photocathode 10 by directing two or more corresponding light beams at the photocathode. Each electron beam is emitted from an ultra small active area of the photocathode having dimensions of two micrometers or less. Each electron beam is stimulated by a light beam. Suitable light beam generators are shown schematically in FIGS. 5 and 6.

Figure 5:
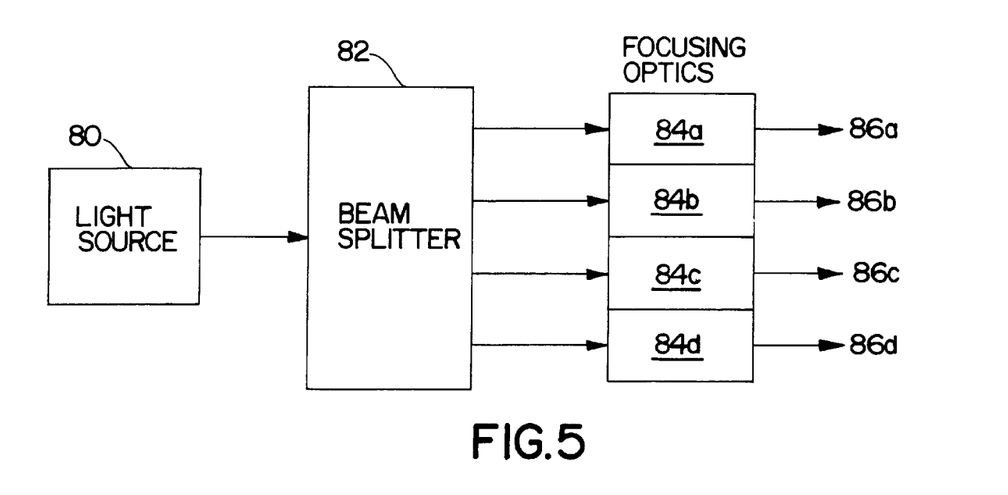
FIGS. 5–8 are block diagrams of different embodiments of the light beam generator.

In FIG. 5 a light source 80 directs a light beam at a beam splitter 82. The beam splitter 82 divides the input beam into two or more light beams which are directed through focusing optics 84a, 84b, 84c and 84d to produce light beams 86a, 86b, 86c and 86d, respectively. Each of the light beams preferably has a cross sectional diameter of two micrometers or less at the surface of photocathode 10 and stimulates emission of electrons from corresponding active areas of photocathode 10. It will be understood that the light beam generator of FIG. 5 can be designed to produce different numbers of light beams.

Figure 6:
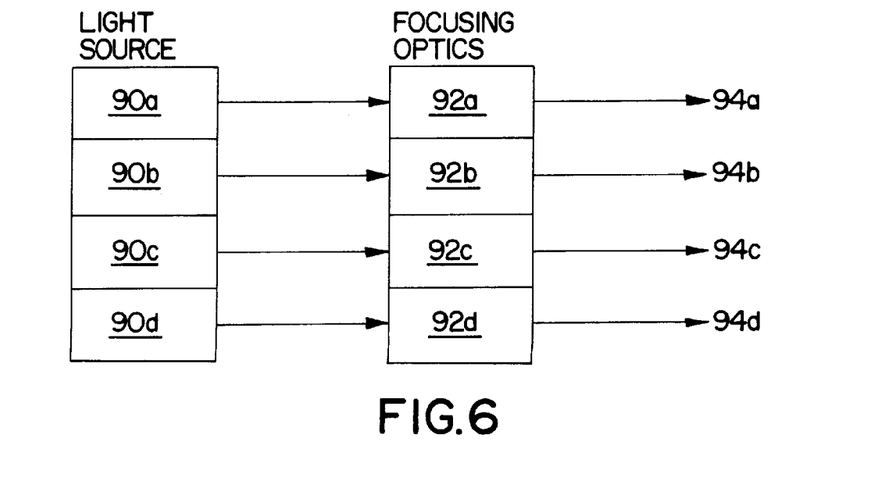

Another light beam generator for generating two or more light beams is illustrated in FIG. 6. Separate light sources 90a, 90b, 90c and 90d direct light at focusing optics 92a, 92b, 92c and 92d to produce light beams 94a, 94b, 94c and 94d, respectively. The light beams are directed at the photocathode 10 and produce corresponding electron beams. An advantage of the embodiment of FIG. 6 is that the light sources 90a, 90b, 90c and 90d may be independently controlled with respect to modulation, power level and the like.

In a further embodiment of the light beam generator 20, a single focusing optics system is used to focus the light output from two or more light sources. In this embodiment, the light sources must be close together. Monolithic arrays of semiconductor lasers or light-emitting diodes may be used, or multiple nonmonolithic lasers or diodes may be fiber coupled to create an array of light sources. In this way, many independently addressable, closely-spaced (approximately 100 micrometer or less) light sources may be imaged by a single lens system with low aberrations (which increase for larger distances from the optical axis).

Figure 7:
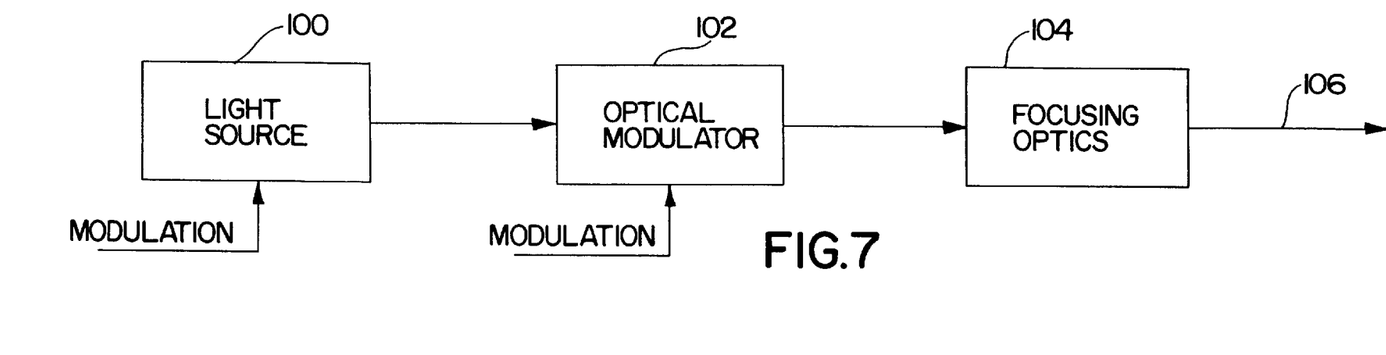

An embodiment of the light beam generator 20 having modulation capabilities illustrated in FIG. 7. A light source 100 directs light through an optical modulator 102 to focusing optics 104. The focusing optics 104 provides a light beam 106, which is directed at an active emission area of photocathode 10. The optical modulator 102 modulates the light beam 106 in accordance with an input modulation signal, which may have any desired waveform, such as, for example, sine wave or pulsed. The light beam 106 may be modulated at frequencies up to the gigahertz range. Alternatively, the light source 100 may be controlled by a modulation signal. For example, a modulation signal may be applied to a laser diode.

Figure 8:
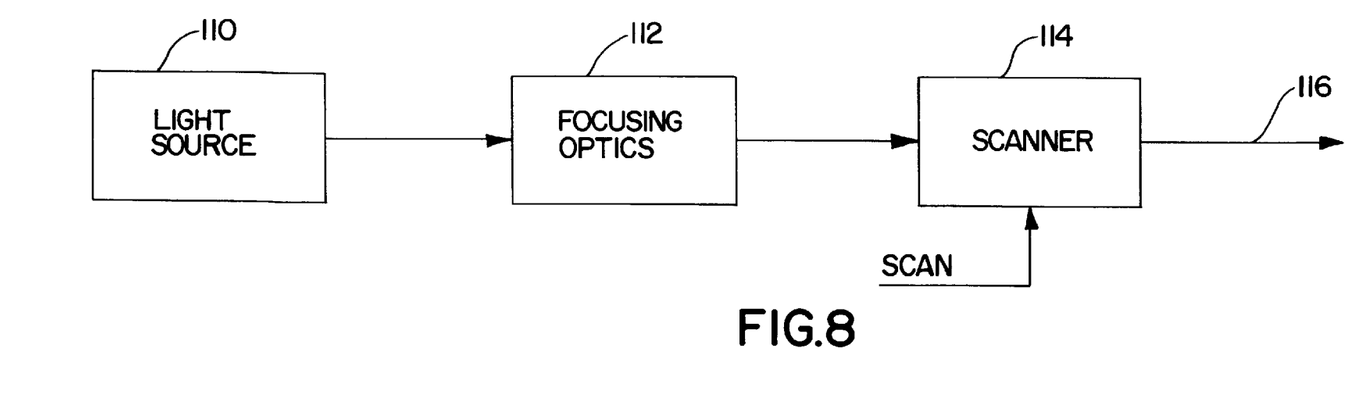

An embodiment of the light beam generator 20 utilizing light beam scanning is shown in FIG. 8. A light source 110 directs light through focusing optics 112 to a light beam scanner 114. The scanner 114 provides a light beam 116 that is scanned over a prescribed range by a scan signal applied to scanner 114. The light beam 116 is scanned over a prescribed region of the photocathode 10 to generate an electron beam that moves across photocathode 10 in accordance with the scanning of light beam 116.

It will be understood that various combinations of the light beam generators shown in FIGS. 1 and 5–8 can be utilized within the scope of the present invention. For example, the multiple light beams shown in FIGS. 5 and 6 may be modulated as shown in FIGS. 7 and/or may be scanned as shown in FIG. 8. The various light beam generators may be utilized in the mode where the active emission area or areas of the photocathode are defined by the incident light beam or the mode where the active emission area or areas are predefined by surface modification of the photocathode 10. When scanning of the light beam is used in conjunction with a photocathode having one or more active emission areas that are predefined by surface modification, an electron beam is produced only when the light beam is scanned over the predefined active emission area of the photocathode.

Different embodiments of patterned negative electron affinity photocathodes are shown in FIGS. 9–15 and described below. Like elements in FIGS. 9–15 have the same reference numerals. In each case, patterning is used to provide one or more small active emission areas on a relatively large area negative electron affinity photocathode. Typically, the patterned photocathode has multiple active emission areas which may be used at different times or simultaneously. In FIGS. 9–15, the active layer is shown as a single layer for ease of understanding. However, it will be understood that the complete NEA photocathode typically includes an antireflection coating, a diffusion blocking layer, an active layer and an activation layer, as described above in connection with FIG. 2. The NEA photocathode may also include variations in doping level in the active layer.

Figure 9:
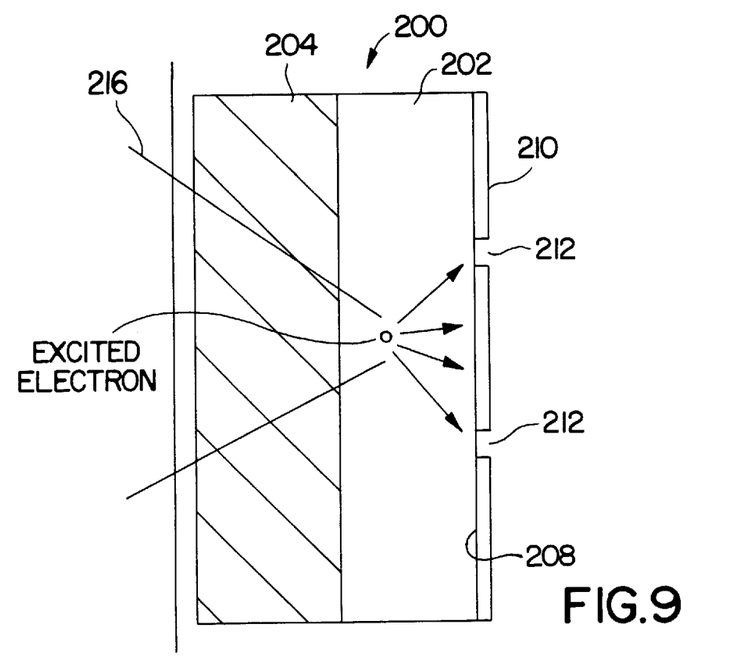
FIG. 9 is a schematic cross-sectional view of a negative electron affinity photocathode having a blocking layer on an emission surface of the active layer.

A first embodiment of a patterned NEA photocathode is shown in FIG. 9. An NEA photocathode 200 includes an active layer 202 on a light-transmissive substrate 204. A patterned mask 210 is formed on an emission surface 208 of active layer 202. The patterned mask 210 has openings 212 which permit emission of electrons from active layer 202. Except in openings 212, mask 210 blocks emission of electrons from active layer 202. Emission of electrons from active layer 202 is stimulated by a light beam 216. The patterned mask 210 forms a blocking layer for blocking emission of electrons from active layer 202 except in openings 212. Preferably, openings 212 are very small, typically less than 2 micrometers in diameter, and thus define very small emission areas.

The blocking layer 210 may be formed using epitaxy and/or lithography to pattern the surface 208 of the active layer 202 with a material having a higher work function than the surrounding region, or with the material that has a very high recombination velocity for electrons. The active layer 202 may be formed as described above. The blocking layer 210 on the emission surface of the active layer is a relatively thin layer with small holes. In general, the blocking layer may be a metal, a dielectric or a semiconductor material having suitable blocking characteristics. The blocking layer may be fabricated of a material such as platinum or palladium, or another high work function material, or may comprise areas of material having the same chemical composition as the active layer but which are electrically inactive. The electrical inactivity may be achieved, for example, by ion implantation or proton implantation. In one example, the structure of FIG. 9 may be fabricated by first epitaxially growing the basic photocathode structure and subsequently forming the blocking layer 210 by lithography, epitaxy, deposition and/or etching.

Figure 10:
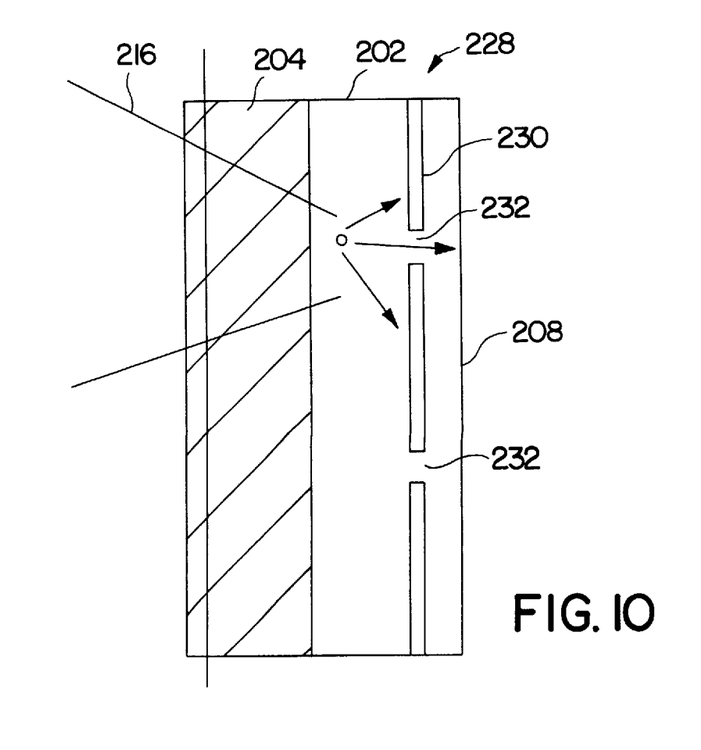
FIG. 10 is a schematic cross-sectional view of a negative electron affinity photocathode having a buried blocking layer located within the active layer.

A second embodiment of a patterned NEA photocathode 228 is shown in FIG. 10. A patterned blocking layer 230 having openings 232 is buried or located within active layer 202. The blocking layer 230 is formed within active layer 202 of a material with a high recombination velocity or low electrical activity to intercept excited electrons as they drift/diffuse toward the emission surface 208 of the active layer 202. The buried blocking layer 230 allows electrons to pass through openings 232, while blocking other electrons from being emitted. The photocathode 228 of FIG. 10 may be fabricated by first growing a portion of active layer on substrate 204 and then fabricating the patterned blocking layer 230. The blocking layer 230 is preferably a metal, such as platinum, palladium or titanium-tungsten, or a semiconductor material with a bandgap larger than the energy of the exciting optical photons, such as aluminum gallium arsenide. Additional material of the active layer 202 may then be deposited by epitaxial growth or other regrowth techniques to provide a uniform surface layer that may be activated to negative electron affinity. The active layer 202 may optionally be formed with a graded bandgap, or bandgap ramp, as described above. Active layer 202 is formed with a larger bandgap semiconductor alloy in a region near substrate 204 and with a smaller bandgap semiconductor alloy near emission surface 208. This structure reduces lateral diffusion of electrons in active layer 202 and thereby reduces emission spot size. The buried blocking layer 230 has an advantage over the configuration shown in FIG. 9 in that the emission surface is less susceptible to contamination and is more uniform. However, the configuration of FIG. 10 is more difficult to fabricate than the configuration of FIG. 9.

The buried blocking layer 230 blocks electrons emitted in the portion of active layer 202 between blocking layer 230 and substrate 204 from reaching the emission surface 208. Blocking layer 230 also blocks light beam 216 from reaching the portion of active layer 202 between blocking layer 230 and the emission surface 208, except through openings 212.

Figure 11:
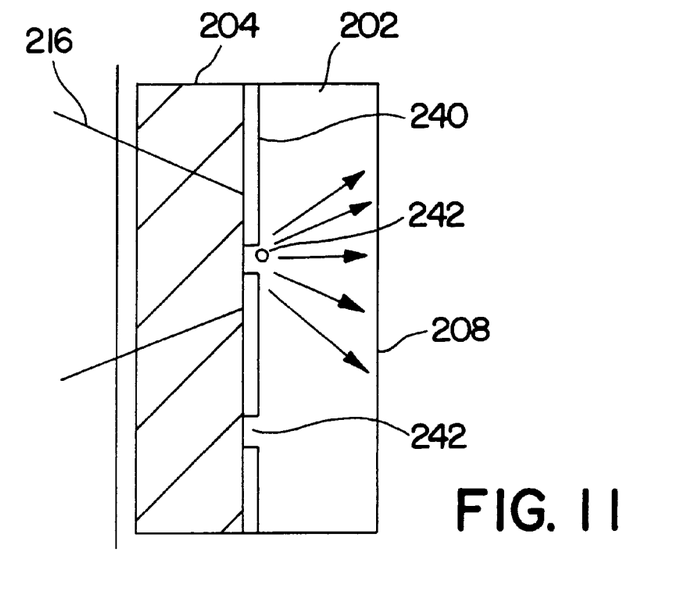
FIG. 11 is a schematic cross-sectional view of a negative electron affinity photocathode having a blocking layer positioned between the active layer and the substrate.

A third embodiment of a patterned NEA photocathode 238 is shown in FIG. 11. A patterned blocking layer 240 having openings 242 is formed between active layer 202 and substrate 204. The blocking layer 240 functions as a light-blocking proximity mask that limits the areas where light beam 216 can excite electrons in the active layer 202. The blocking layer 240 is an opaque or reflective material, such as platinum, palladium or titanium-tungsten, which may be deposited on the back side of active layer 202. Light beam 216 passes through openings 242 in blocking layer 240 to active layer 202. Emitted electrons diffuse to the surface 208 of the active layer 202, where they are emitted.

A disadvantage of the configuration shown in FIG. 11 is that electrons spread due to diffusion within the active layer 202 as they travel to the emission surface 208 of active layer 202. This causes an undesirable increase in the emission spot size.

Figure 12:
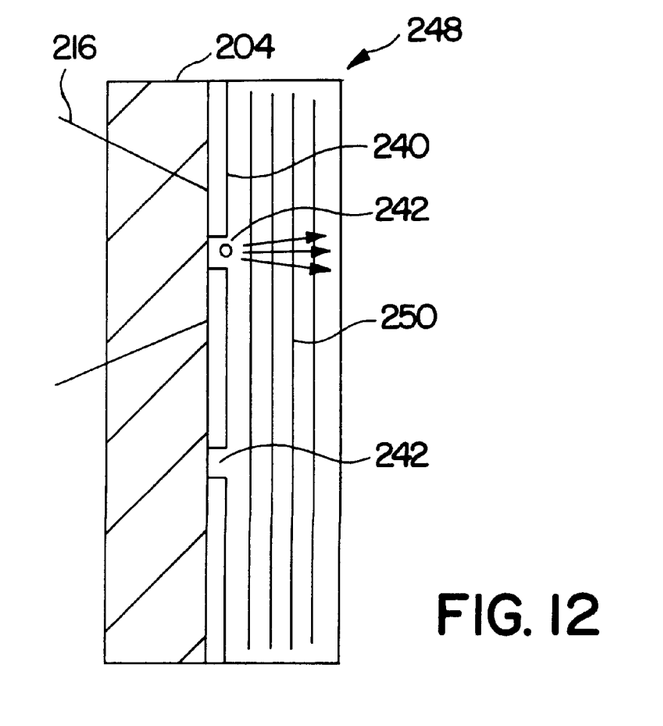
FIG. 12 is a schematic cross-sectional view of a negative electron affinity photocathode having a blocking layer and a bandgap ramp for directing electrons toward the emission surface.

A fourth embodiment of a patterned NEA photocathode 248, in which this difficulty is alleviated, is shown in FIG. 12. An active layer 250 is formed with a graded bandgap, or bandgap ramp, as described above. Active layer 250 is formed with a larger bandgap semiconductor alloy in a region near blocking layer 240 and with a smaller bandgap semiconductor alloy near emission surface 208. This structure subjects excited electrons in the active layer 250 to a potential gradient, which causes the electrons to be forced toward the emission surface 208 quickly, before they diffuse laterally.

An additional drawback of the configuration shown in FIG. 11 is that optical transmission through a proximity mask is very small, if the openings in the mask are less than one half the wavelength of the light beam 216. This is often the case for applications of interest, for example, using a light beam having a 600 nanometer wavelength and openings in the blocking layer of 100 nanometers.

Figure 13:
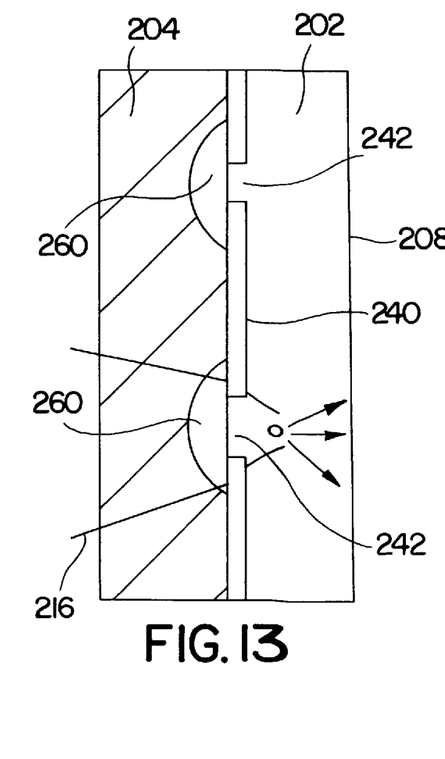
FIG. 13 is a schematic cross-sectional view of a negative electron affinity photocathode including a blocking layer and a material having a high index of refraction located in openings in the blocking layer.

A fifth embodiment of a patterned NEA photocathode 258, in which this difficulty is alleviated, is shown in FIG. 13. A material 260 having a high index of refraction, such as for example 3.0, such as aluminum gallium arsenide or a dielectric, is deposited in the openings 242 in blocking layer 240. The high index material 260 may be deposited in a region of substrate 204 surrounding openings 242. The high index material 260 causes the effective wavelength at the interface to blocking layer 240 to be reduced. Furthermore, the surface of high index material 260 may be shaped as a lens element, as shown in FIG. 13, to concentrate light beam 216 at openings 242. The high index material 260 causes the amount of light that is transmitted through openings 242 in blocking layer 240 to be significantly increased.

Figure 14:
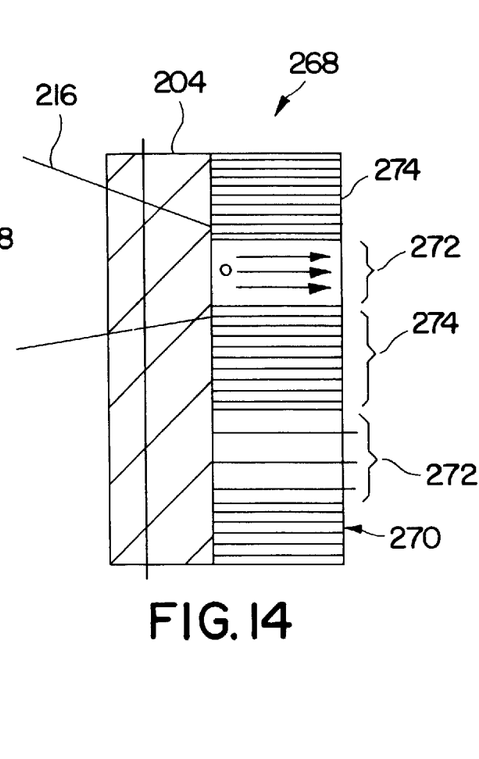
FIG. 14 is a schematic cross-sectional view of a negative electron affinity photocathode having a laterally graded active layer.

A sixth embodiment of a patterned NEA photocathode 268 is shown in FIG. 14. An active layer 270 is laterally graded parallel to emission surface 208 to include low bandgap regions 272 and high bandgap regions 274. High bandgap regions 274 surround low bandgap regions 272. Electrons emitted within low bandgap regions 272 of active layer 270 diffuse toward emission surface 208 and are emitted from surface 208. The tendency of electrons to diffuse laterally in active layer 270 is suppressed by the surrounding high bandgap regions 274, thereby reducing emission spot size. The laterally graded active layer 270 confines electrons within low bandgap regions 272 and provides lateral potential gradients for controlling emission spot size. The laterally graded active layer 270 may be fabricated, for example, by growing the active layer laterally using many stacks of epitaxial material. Another way of fabricating the laterally graded active layer is to alter the bandgap of the active layer material by using lithography to drive in materials that alter the bandgap in selected regions.

Figure 15:
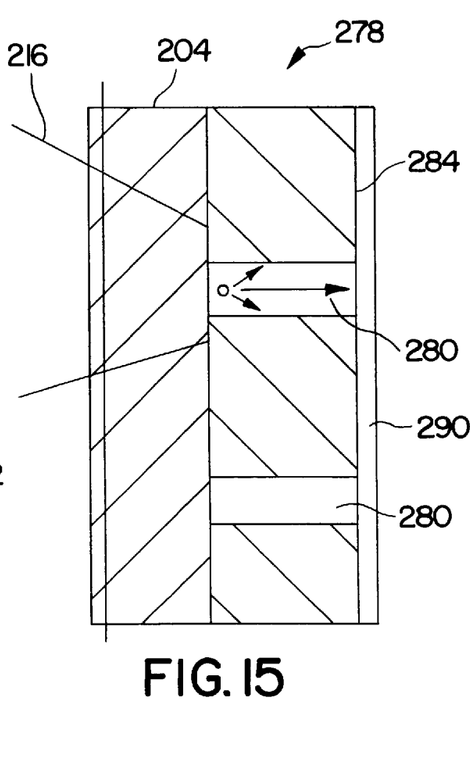
FIG. 15 is a schematic cross-sectional view of a negative electron affinity photocathode having pillars of active material located in a layer of inactive material.

A seventh embodiment of a patterned NEA photocathode 278 is shown in FIG. 15. Pillars 280 of active cathode material, such as gallium arsenide, are embedded in a layer 284 of inactive material such as a metal (platinum, palladium or titanium-tungsten), a dielectric (such as glass), or a high bandgap semiconductor (aluminum gallium arsenide, etc.). A uniform surface layer 290 of active material may optionally be placed over inactive layer 284 and active pillars 280 to provide a uniform emission surface. In this embodiment, light beam 216 may excite carriers only in the active pillars 280. As excited electrons diffuse through pillars 280, they may recombine at the interface between the active and inactive materials or may be emitted at the surfaces of pillars 280.

A bandgap ramp may be used to improve the performance in terms of emission area and/or quantum efficiency for any of the above patterned NEA photocathode structures.

Small emission areas may be achieved using a reflection-mode photocathode, which is illuminated from the same side from which the electrons are emitted. Some of the techniques mentioned above (especially surface patterning, surface-parallel bandgap grading, and the pillar approach) may help to provide a small emission area in this case. In this case, a light-transmissive substrate and an anti-reflection layer are unnecessary. However, there are several disadvantages to this approach. First, since the light optics cannot be placed close to the cathode surface, a small optical spot is much more difficult to achieve. A large optical spot reduces the efficiency with which the light can cause emission from the desired emission area. In the case of multiple emission areas, the emission areas must be far enough apart that the light illuminating one spot does not cause emission at another spot. A large optical spot forces the individual emission areas to be further apart, which may cause additional aberrations in the electron optics, as more electrons will be further off-axis. Finally, placing the light optics above the emitting surface significantly complicates the design of the electron optics, and may degrade their performance.

In addition to stimulating emission using light, it may be desirable to inject electrons into the conduction band electrically. For example, a junction may be formed below the emission surface and then biased to place electrons into the conduction band, from which they may be emitted. By controlling this bias, the emission can be controlled. In this case it may be desirable to employ some of the above-described techniques to limit the emission area, for all the reasons previously discussed.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A negative electron affinity photocathode comprising:
   a light-transmissive substrate;
   a negative electron affinity active layer disposed on said substrate; and
   a patterned mask associated with said active layer, said mask having one or more openings that define areas of said active layer for emission of electrons by negative electron affinity when said active layer is stimulated by a light beam directed through said substrate.

2. A negative electron affinity photocathode as defined in claim 1 wherein said mask comprises a blocking layer on an emission surface of said active layer.

3. A negative electron affinity photocathode as defined in claim 2 wherein said blocking layer comprises a metal layer.

4. A negative electron affinity photocathode as defined in claim 2 wherein said blocking layer comprises a semiconductor layer.

5. A negative electron affinity photocathode as defined in claim 2 wherein said blocking layer comprises a dielectric layer.

6. A negative electron affinity photocathode as defined in claim 1 wherein said mask comprises a buried blocking layer located within said active layer.

7. A negative electron affinity photocathode as defined in claim 1 wherein said mask comprises a blocking layer disposed between said active layer and said substrate.

8. A negative electron affinity photocathode as defined in claim 1 wherein said mask comprises an electron blocking layer for blocking electrons emitted by said active layer.

9. A negative electron affinity photocathode as defined in claim 1 wherein said mask comprises a light blocking layer for blocking the light beam directed through said substrate.

10. A negative electron affinity photocathode as defined in claim 9 further comprising a material having a high index of refraction located in said one or more openings.

11. A negative electron affinity photocathode as defined in claim 10 wherein said high index material is shaped as a lens adjacent to said one or more openings.

12. A negative electron affinity photocathode as defined in claim 1 wherein said active layer includes a bandgap ramp through the thickness thereof for producing an electric field for directing electrons emitted within said active layer toward an emission surface of said active layer.

13. A negative electron affinity photocathode as defined in claim 1 wherein said one or more openings have dimensions less than about 2 micrometers.

14. A negative electron affinity photocathode as defined in claim 1 wherein said mask comprises an electrically inactive region of said active layer.

15. A negative electron affinity photocathode as defined in claim 1 wherein said mask comprises a metal blocking layer disposed on or within said active layer.

16. An electron source comprising:
   a light-transmissive substrate;
   a negative electron affinity active layer disposed on said substrate, said active layer having a conduction band;

a patterned mask associated with said active layer, said mask having one or more openings that define areas of said active layer for emission of electrons;

a light beam generator for directing a light beam through said light-transmissive substrate at said active layer for exciting electrons into the conduction band of said active layer;

electron optics for forming the electrons emitted from the emission areas of said active layer into an electron beam; and a vacuum enclosure for maintaining said active layer at high vacuum such that electrons in the conduction band of said active layer have higher energies than electrons in the vacuum enclosure adjacent to said active layer and have a high probability of emission into the vacuum enclosure from the emission areas of said active layer.

17. An electron source as defined in claim 16 wherein said mask comprises a blocking layer on an emission surface of said active layer.

18. An electron source as defined in claim 16 wherein said mask comprises a buried blocking layer disposed within said active layer.

19. An electron source as defined in claim 16 wherein said mask comprises a blocking layer disposed between said active layer and said substrate.

20. An electron source as defined in claim 16 wherein said mask comprises an electron blocking layer for blocking electrons emitted by said active layer.

21. An electron source as defined in claim 16 wherein said mask comprises a light blocking layer for blocking the light beam directed through said light-transmissive substrate at said active layer.

22. An electron source as defined in claim 16 wherein said mask comprises an electrically inactive region of said active layer.

23. An electron beam system comprising:

an electron source comprising:

a light-transmissive substrate;

a negative electron affinity active layer disposed on said substrate, said active layer having a conduction band;

a patterned mask associated with said active layer, said mask having one or more openings that define areas of said active layer for emission of electrons;

a light beam generator for directing a light beam through said light-transmissive substrate at said active layer for exciting electrons into the conduction band of said active layer;

source electron optics for forming the electrons emitted from the emission areas of said active layer into an electron beam; and a source vacuum enclosure for maintaining said active layer at high vacuum such that electrons in the conduction band of said active layer have higher energies than electrons in the source vacuum enclosure adjacent to said active layer and have a high probability of emission into the source vacuum enclosure from the emission areas of said active layer;

a main vacuum enclosure for receiving said electron beam from said electron source and for holding a workpiece for processing by said electron beam; and main electron optics located within said main vacuum enclosure for directing said electron beam to said workpiece.

24. A negative electron affinity photocathode comprising:

a light-transmissive substrate; and a negative electron affinity active layer disposed on said substrate, said active layer having an emission surface and being laterally graded with respect to bandgap in a direction parallel to said emission surface, said laterally graded active layer defining low bandgap regions for emission of electrons by negative electron affinity when said active layer is stimulated by a light beam directed through said substrate, said laterally graded active layer further defining high bandgap regions surrounding said low bandgap regions.

25. A negative electron affinity photocathode comprising:

a light-transmissive substrate;

an inactive layer disposed on said substrate; and one or more pillars of negative electron affinity active material extending through said inactive layer from said substrate to a surface of said inactive layer, said pillars defining areas for emission of electrons by negative electron affinity when said pillars are stimulated by a light beam directed through said substrate.

26. A negative electron affinity photocathode as defined in claim 25 further comprising a layer of negative electron affinity active material covering said inactive layer and said pillars.

* * * * *